(12) United States Patent
Cho et al.

(10) Patent No.: US 11,251,340 B2
(45) Date of Patent: Feb. 15, 2022

(54) LIGHT-EMITTING DEVICE WITH DISTRIBUTED BRAGG REFLECTION STRUCTURE

(71) Applicant: EPISTAR CORPORATION, Hsinchu (TW)

(72) Inventors: Heng-Ying Cho, Hsinchu (TW); De-Shan Kuo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 80 days.

(21) Appl. No.: 16/749,536

(22) Filed: Jan. 22, 2020

(65) Prior Publication Data

US 2020/0235267 A1 Jul. 23, 2020

(30) Foreign Application Priority Data

Jan. 23, 2019 (TW) .................. 108102483

(51) Int. Cl.
*H01L 33/46* (2010.01)
*H01L 33/10* (2010.01)
*H01L 33/60* (2010.01)
*H01L 33/50* (2010.01)

(52) U.S. Cl.
CPC .............. *H01L 33/46* (2013.01); *H01L 33/10* (2013.01); *H01L 33/50* (2013.01); *H01L 33/60* (2013.01)

(58) Field of Classification Search
CPC .......... H01L 33/50; H01L 33/46; H01L 33/60; H01L 33/10; H01L 33/44
See application file for complete search history.

(56) References Cited

U.S. PATENT DOCUMENTS

2011/0079800 A1 4/2011 Konno
2012/0161176 A1 6/2012 Heo et al.
2013/0058102 A1 3/2013 Lin

FOREIGN PATENT DOCUMENTS

CN 202735531 U 2/2013

*Primary Examiner* — Savitri Mulpuri
(74) *Attorney, Agent, or Firm* — Ditthavong, Steiner & Mlotkowski

(57) ABSTRACT

A light-emitting device includes a substrate, having a first surface and second surface opposite to the first surface; a light-emitting stack, formed on the first surface of the substrate, the light-emitting stack including a first semiconductor layer, an active layer and a second semiconductor layer, wherein the active layer is formed between the first conductive semiconductor layer and the second conductive semiconductor layer; and a distributed Bragg reflection structure (DBR), formed on the second surface of the substrate, including a plurality of dielectric-layer pair formed sequentially on the second surface, wherein each of the dielectric-layer pairs includes respectively a first dielectric layer having a first optical thickness and a second dielectric layer having a second optical thickness, and wherein from the second surface, the first dielectric layer of each of the dielectric-layer pairs is thicker than the first dielectric layer of the adjacent previous dielectric-layer pair.

20 Claims, 8 Drawing Sheets

LIGHT-EMITTING DEVICE WITH DISTRIBUTED BRAGG REFLECTION STRUCTURE

CROSS REFERENCE TO RELATED APPLICATIONS

This application claims the right of priority based on TW Application Serial No. 108102483, filed Jan. 23, 2019, the content of which is hereby incorporated by reference in its entirety.

TECHNICAL FIELD

The application relates to a light-emitting device, and more particularly, to a light-emitting device having a distributed Bragg reflection (DBR) structure.

DESCRIPTION OF BACKGROUND ART

Light-emitting Diode (LED) is a solid-state semiconductor device having a p-n junction formed between a p-type semiconductor layer and an n-type semiconductor layer. When imposing a certain level of forward voltage to an LED, holes from the p-type semiconductor layer can radiatively recombine with electrons from the n-type semiconductor layer to release light. The region where the recombination occurs is generally called a light-emitting region or an active layer.

As shown in FIG. 1, a conventional light-emitting device 10 includes a substrate 100; a DBR structure 120 under the substrate 100; a first conductive semiconductor layer 142, a second conductive semiconductor layer 144, and an active layer 146 on the substrate 100; a first electrode 160 and a second electrode 180 on the first conductive semiconductor layer 142 and the second conductive semiconductor layer 144 respectively. The DBR structure 120 includes multiple dielectric layers which are alternately stacked with each other. The light from the active layer 146 can be reflected by the DBR structure 120. FIG. 2 shows in each dielectric-layer pair of the DBR structure 120, the ratios of the first optical thickness of the first dielectric layer and the second optical thickness of the second dielectric layer respectively to the central wavelength λ (such as 550 nm) of the visible light band (such as 400 nm to 700 nm). The material of the first dielectric layer is silicon dioxide ($SiO_2$). The material of the second dielectric layer is titanium dioxide ($TiO_2$). The optical thickness is defined as the product of the physical thickness of the dielectric layer and the refractive index of the dielectric layer.

When the light generated by the active layer 146 of the light-emitting device 10 contacts the DBR structure 120, the direction of incidence of the light L is at an angle θ with the normal n of the DBR structure 120, which is defined as the incident angle. Referring to FIG. 7, a simulation data of the reflectivity of the DBR structure 120 to the incident light having a wavelength range of 350 nm to 1050 nm when the incident angle θ is 0 degree is shown. The reflectivity of the DBR structure 120 to the blue light band such as 400 nm to 450 nm is low along with the average reflectivity lower than 50%. In addition, referring to FIG. 3, a simulation data of the reflectivity of the DBR structure 120 in a variety of different incident angle θ when the incident light wavelength is 450 nm is shown. The reflectivity of the DBR structure 120 in the incident angle θ the ranging from 40 degrees to 65 degrees is lower than other incident angles.

SUMMARY OF THE APPLICATION

One objective of the present disclosure is to provide a light-emitting device which includes a substrate, a light-emitting stack, and a distributed Bragg reflection structure. The substrate includes a first surface and a second surface opposite to the first surface. The light-emitting stack is formed on the first surface of the substrate and includes a first semiconductor layer, a second semiconductor layer, and an active layer between the first semiconductor layer and the second semiconductor layer. The distributed Bragg reflection structure is formed on the second surface of the substrate and includes a plurality of dielectric-layer pairs sequentially arranged outward from the second surface. Each of the dielectric-layer pairs includes a first dielectric layer having an optical thickness and a second dielectric layer having an optical thickness. The optical thickness of the first dielectric layer of each one of the dielectric-layer pairs is greater than the optical thickness of the first dielectric layer of an adjacent previous one of the dielectric-layer pairs from the second surface outward.

Another objective of the present disclosure is to provide a light-emitting device which includes a substrate, a light-emitting stack, and a distributed Bragg reflection structure. The substrate includes a first surface and a second surface opposite to the first surface. The light-emitting stack is formed on the first surface of the substrate and includes a first conductive semiconductor layer, a second conductive semiconductor layer, and an active layer between the first conductive semiconductor layer and the second conductive semiconductor layer. The distributed Bragg reflection structure is formed on the second surface of the substrate and includes a first film stack and a second film stack. The first film stack includes a plurality of first dielectric-layer pairs. The second film stack includes a plurality of second dielectric-layer pairs. Each of the first dielectric-layer pairs and each of the second dielectric-layer pairs respectively include a first dielectric layer having an optical thickness and a second dielectric layer having an optical thickness. In each of the dielectric-layer pairs of the first film stack, the optical thickness of the first dielectric layer and the optical thickness of the second dielectric layer have a ratio, and the ratio is greater than or equal to 1.5 and less than or equal to 1.8.

DETAILED DESCRIPTION OF PREFERRED EMBODIMENTS

Figure 1:
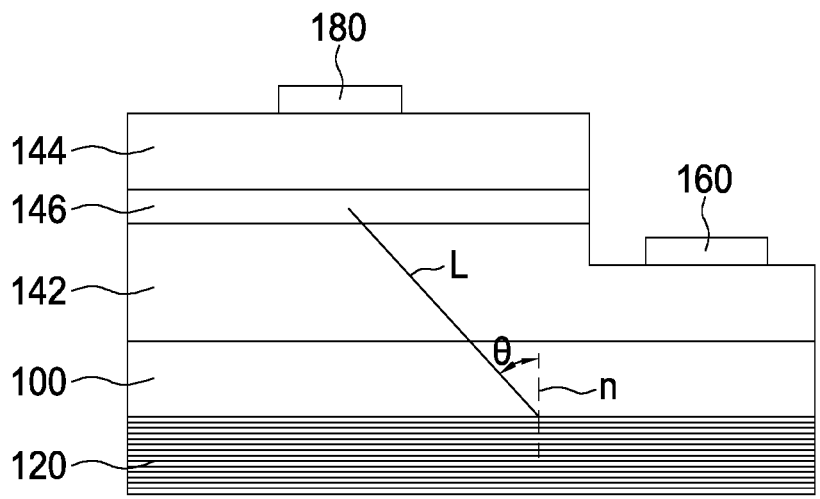
FIG. 1 illustrates a cross-sectional view of a conventional light-emitting device having a DBR structure 120.
Figure 2:
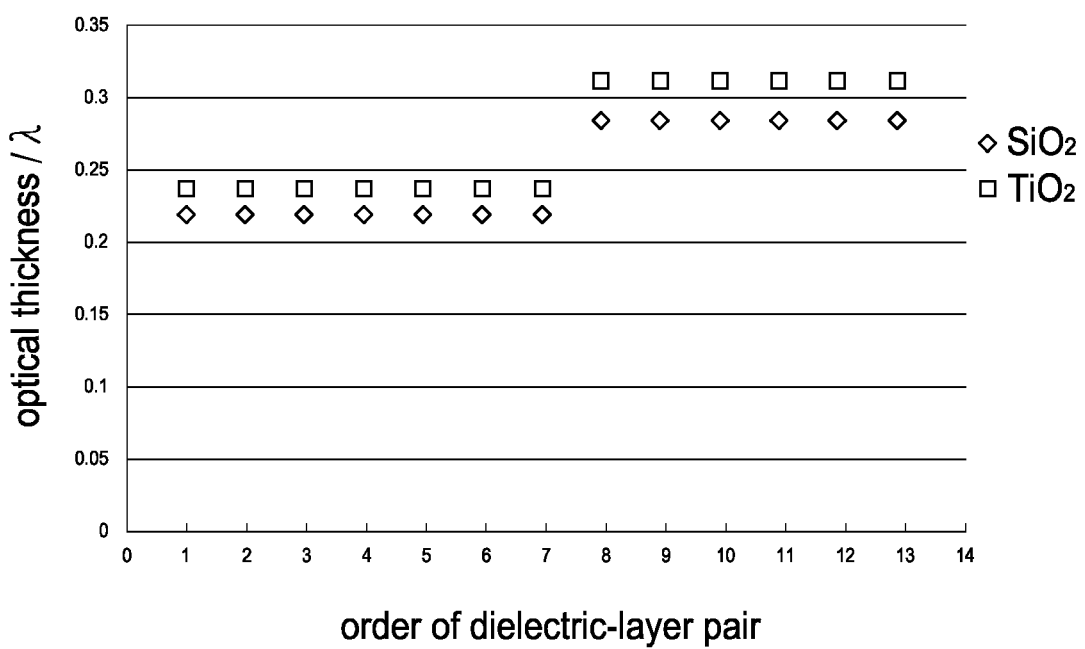
FIG. 2 illustrates a simulation data showing the ratios of the first optical thickness of the first dielectric layer and the second optical thickness of the second dielectric layer respectively to the central wavelength λ of the visible light band in each dielectric-layer pair of a DBR structure 120.
Figure 3:
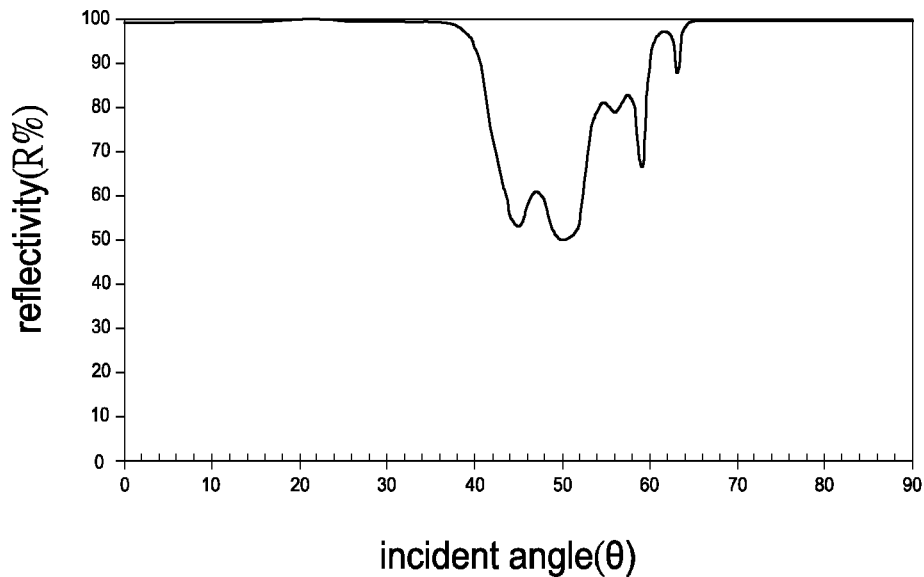
FIG. 3 illustrates a simulation data showing the reflectivity of the DBR structure 120 in a variety of different incident angle θ when the incident light wavelength is 450 nm.

The embodiments of the present disclosure will be described in detail and drawn in the drawings, and the same or similar parts will appear in the drawings and descriptions with the same numbers. The embodiments of the present disclosure can be understood together with the drawings, and the drawings are also considered as a part of the description of the embodiments of the present disclosure. It should be understood that the drawings are not drawn with the actual device and component ratios. The shapes and thicknesses of the embodiments may be exaggerated in the drawings so as to clearly show the features of the embodiments of the present disclosure.

In addition, certain terms such as "below", "above", "under", "on", "lower" or "bottom", and "upper" or "top" may be used in embodiments to describe the relative relationship of one device to another device of a drawing. It can be understood that if the illustrated device is turned upside down, the components described on the "below", "under", and "lower" sides will become the components on the "above", "on", and "upper" side.

Terms such as "first", "second", and "third" and so on may be used in embodiments to describe various devices, components, regions, layers, and/or portions, but should not be limited by these terms, these terms are only used for distinguish between different devices, components, regions, layers, and/or portions. Accordingly, a first device, component, region, layer, and/or portion discussed below may be referred to as a second device, component, region, layer, and/or portion without departing from the teachings of the embodiments of the present disclosure.

Figure 4:
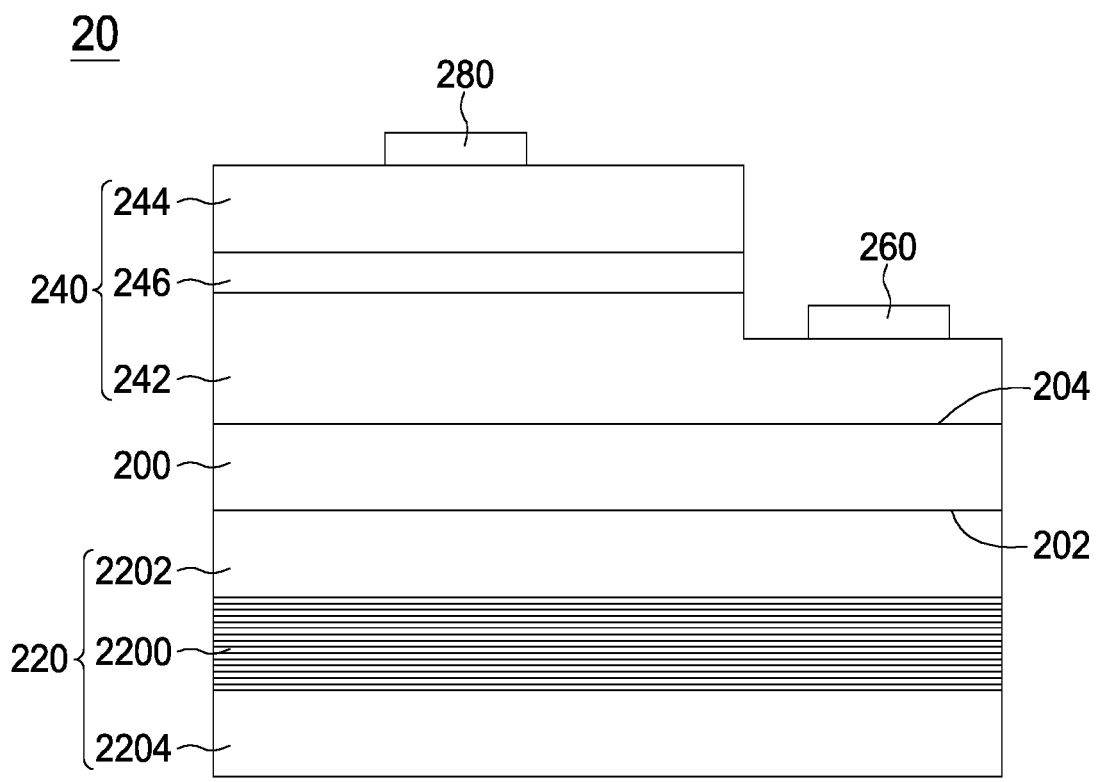
FIG. 4 illustrates a cross-sectional view of a light-emitting device in accordance with an embodiment of the present disclosure.

FIG. 4 shows a cross-sectional view of a light-emitting device 20 in accordance with an embodiment of the present disclosure. The light-emitting device 20 includes a substrate 200, a light extraction structure 220, a light-emitting stack 240, a first electrode 260, and a second electrode 280. The substrate 200 has a first surface 202 and a second surface 204 which are opposite to each other. The light extraction structure 220 is formed under the first surface 202. The light-emitting stack 240 is formed on the second surface 204 of the substrate 200. The light-emitting stack 240 includes a first conductive semiconductor layer 242, a second conductive semiconductor layer 244, and an active layer 246 between the first conductive semiconductor layer 242 and the second conductive semiconductor layer 244. The first electrode 260 and the second electrode 280 are located on the first conductive semiconductor layer 242 and the second conductive semiconductor layer 244, respectively.

The substrate 200 may be used to grow and/or support the light-emitting stack 240 located thereon, and the material of the substrate 200 is transparent with respect to the light generated by the light-emitting stack 240. The material of the substrate 200 may include an insulating material, a conductive material, or both. The insulating material can be sapphire, diamond, glass, quartz, acryl, or AlN. The conductive material may be a semiconductor material, such as silicon carbide (SiC)), gallium arsenide (GaAs), germanium (Ge), gallium phosphide (GaP), gallium phosphorous arsenide (GaAsP), selenide zinc (ZnSe), indium phosphide (InP), zinc oxide (ZnO), lithium gallate (LiGaO$_2$), or lithium aluminate (LiAlO$_2$). When the substrate 200 is provided for allowing the light-emitting stack 240 to be grown, the material of the substrate 200 can be selected from a single-crystal material that matches or approximates the lattice of the light-emitting stack 240 thereon, such as sapphire, silicon carbide, gallium arsenide, or gallium phosphide.

The light-emitting stack 240 may be grown on the substrate 200, or attached to the substrate 200 by a bonding layer (not shown). The material of the light-emitting stack 240 may be a semiconductor material, including one or more devices, and the device may be selected from gallium (Ga), aluminum (Al), indium (In), phosphorus (P), nitrogen (N), and zinc (Zn), Cadmium (Cd) and selenium (Se). The first conductive semiconductor layer 242 and the second conductive semiconductor layer 244 are different in electrical properties to generate electrons or holes. The active layer 246 may generate one or more colored lights, which may be visible light or invisible light. In one embodiment, the active layer 246 generates visible light. The structure of the active layer 246 may be a single heterostructure (SH), a double heterostructure (DH), or a multi-quantum well structure (MQW).

The first electrode 260, the second electrode 280, or both are used to receive an external power source, and may be composed of a transparent conductive material, a metal material, or both. The transparent conductive material includes metal oxide, diamond-like carbon film (DLC), graphene, or a combination of any of the above material. The metal oxide includes, but is not limited to, indium tin oxide (ITO), indium oxide (InO), and tin oxide (SnO), cadmium tin oxide (CTO), antimony tin oxide (ATO), zinc aluminum oxide (AZO), zinc tin oxide (ZTO), zinc oxide (ZnO), indium zinc oxide (IZO), gallium zinc oxide (GZO), or a combination of any of the above materials. The metal material includes copper (Cu), aluminum (Al), indium (In), tin (Sn), gold (Au), platinum (Pt), zinc (Zn), silver (Ag), titanium (Ti), nickel (Ni), lead (Pb), palladium (Pd), germanium (Ge), chromium (Cr), cobalt (Co), cadmium (Cd), manganese (Mn), antimony (Sb), bismuth (Bi), Gallium (Ga), tungsten (W), beryllium (Be), or alloys of any of the above materials.

The light extraction structure 220 has a DBR structure 2200, an interface layer 2202, and an anti-interference layer 2204. The interface layer 2202 is located under the first surface 202 of the substrate 200. The anti-interference layer 2204 is located under the interface layer 2202. The DBR structure 2200 is located between the interface layer 2202 and the anti-interference layer 2204. The DBR structure 2200 has a plurality of dielectric-layer pairs. In another embodiment, the light extraction structure 220 includes the DBR structure 2200, and either the anti-interference layer 2202 or the interface layer 2204.

In one embodiment, the interface layer 2202 is used to increase the adhesion between the substrate 200 and the DBR structure 2200. The material of the interface layer 2202 is transparent with respect to the light emitted by the light-emitting stack 240 and may include a conductive material or an insulating material. The conductive material may be indium tin oxide (ITO), indium oxide (InO), tin oxide (SnO), cadmium tin oxide (CTO), antimony tin oxide (ATO), zinc oxide (ZnO), magnesium oxide (MgO), arsenic Aluminum gallium (AlGaAs), gallium nitride (GaN), gallium phosphide (GaP), zinc aluminum oxide (AZO), zinc tin oxide (ZTO), zinc gallium oxide (GZO) or indium zinc oxide (IZO). The insulating material may be silicon dioxide ($SiO_2$), magnesium fluoride ($MgF_2$), titanium dioxide ($TiO_2$), tantalum pentoxide ($Ta_2O_5$), niobium pentoxide ($Nb_2O_5$) or other suitable materials. In one embodiment, the interface layer 2202 may be formed by physical vapor deposition (PVD) or chemical vapor deposition (CVD). The physical vapor deposition method may be sputtering or electron beam evaporation (E-Beam evaporation). The chemical vapor deposition may be plasma-enhanced CVD (PECVD), atomic layer deposition (ALD), and so on. The DBR structure 2200 may also be formed in one of the above-mentioned manners, and the DBR structure 2200 and the interface layer 2202 may be formed in the same or different manners. In one embodiment, the interface layer 2202 forms a dense film layer by using the above-mentioned chemical vapor deposition method in order to increase the adhesion between the interface layer 2202 and the substrate 200, thereby increasing the adhesion between the substrate 200 and the DBR structure 2200. The DBR structure 2200 with multi-layered dielectric-layer pairs can be quickly formed by a physical vapor deposition method.

In one embodiment, the optical thickness of the interface layer 2202 is between about 100 nm and 1000 nm. In another embodiment, the optical thickness of the interface layer 2202 is greater than or equal to a length of a central wavelength of a visible light band, so as to improve the light extraction efficiency of the light-emitting device 20. In one embodiment, the optical thickness of the interface layer 2202 is about 900 nm to 1000 nm, and the material of the interface layer 2202 is $SiO_2$.

In the manufacturing process of the light-emitting device 20, when the wafer is divided by scribing to form a plurality of light-emitting device 20, the laser beam is incident on the wafer from the side of the first surface 202 of the substrate 200. The anti-interference layer 2204 can be provided to reduce the reflectivity of the laser beam (having a wavelength such as above 900 nm), so as to improve the efficiency of the scribing and the yield of the light-emitting device 20.

The material of the anti-interference layer 2204 is transparent with respect to the light emitted by the light-emitting stack 240 and may include a conductive material or an insulating material. The conductive material can be indium tin oxide (ITO), indium oxide (InO), tin oxide (SnO), cadmium tin oxide (CTO), antimony tin oxide (ATO), zinc oxide (ZnO), magnesium oxide (MgO), arsenic Aluminum gallium (AlGaAs), gallium nitride (GaN), gallium phosphide (GaP), zinc aluminum oxide (AZO), zinc tin oxide (ZTO), zinc gallium oxide (GZO), or indium zinc oxide (IZO). The insulation material includes silicon dioxide ($SiO_2$), magnesium fluoride ($MgF_2$), titanium dioxide ($TiO_2$), tantalum pentoxide ($Ta_2O_5$), niobium pentoxide ($Nb_2O_5$), or other suitable materials.

In one embodiment, the optical thickness of the anti-interference layer 2204 is between about 100 nm and 1000 nm. In one embodiment, the material of the anti-interference layer 2204 is $SiO_2$, and its optical thickness is about 300 nm to 400 nm. In one embodiment, the optical thickness of the anti-interference layer 2204 is approximately ⅛ of a central wavelength of a visible light band, and the optical thickness of the anti-interference layer 2204 is ranging approximately 67 nm to 69 nm, thereby improving the light extraction efficiency of the light-emitting device 20. From a cross-sectional view, the interface layer 2202 and the anti-interference layer 2204 have a width substantially equal to that of the substrate 200. In another embodiment, the interface layer 2202 may have a width larger or smaller than that of the anti-interference layer 2204 from a cross-sectional view, so as to adjust a light field of the light-emitting device 20 to meet a downstream product application.

The DBR structure 2200 has a plurality of dielectric-layer pairs sequentially arranged outward from the first surface 202 of the substrate 200 to reflect light from the light-emitting stack 240, wherein each of the dielectric-layer pairs includes a first dielectric layer and a second dielectric layer respectively (not shown). The first dielectric layer has a first optical thickness and a first refractive index, and the second dielectric layer has a second optical thickness and a second refractive index. The difference between the first refractive index and the second refractive index is at least 0.5, and preferably at least 1. In one embodiment, the materials of the first dielectric layer and the second dielectric layer include titanium dioxide ($TiO_2$) and silicon dioxide ($SiO_2$). The refractive indexes of $TiO_2$ and $SiO_2$ are 2.6 and 1.5, respectively.

Figure 5:
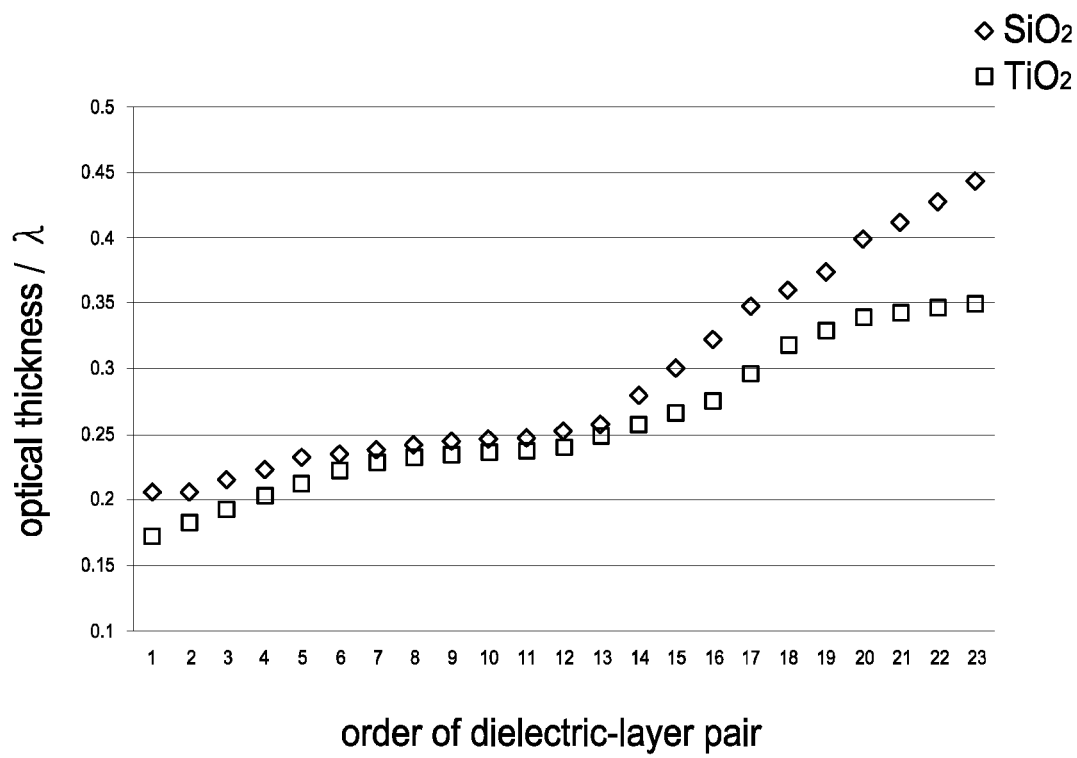
FIG. 5 illustrates a data showing that in each the dielectric-layer pair of the DBR structure 2200, the ratios of the first optical thickness of the first dielectric layer and the second optical thickness of the second dielectric layer respectively to the central wavelength λ of the visible light band, in accordance with an embodiment of the present disclosure.

FIG. 5 shows the ratios of the first optical thickness of the first dielectric layer and the second optical thickness of the second dielectric layer respectively to the central wavelength λ (such as 550 nm) of the visible light band (such as 400 nm to 700 nm) in each of the dielectric-layer pairs of the DBR structure 2200 disclosed in an embodiment of the present disclosure. As shown in FIG. 5, the DBR structure 2200 includes a plurality of dielectric-layer pairs, such as the 1st pair to the 23rd pair. The numbers of the dielectric-layer pairs may be reduced or increased according to the product application. In the DBR structure 2200, the first optical thickness of the first dielectric layer of each dielectric-layer pair is greater than the first optical thickness of the first dielectric layer of the adjacent previous dielectric-layer pair, or the second optical thickness of the first dielectric layer of each dielectric-layer pair is greater than the first optical thickness of the first dielectric layer of the adjacent previous dielectric-layer pair, when the central wavelength λ is set. In other words, along the direction from the first surface 202 outward the substrate 200, regarding the first dielectric layer in the DBR structure 2200, the first optical thickness of the first dielectric layer shows an increasing trend in every adjacent two dielectric-layer pairs. Similarly, along the direction from the first surface 202 outward the substrate 200, regarding the second dielectric layer in the DBR structure 2200, the second optical thickness of the second dielectric layer shows an increasing trend in every adjacent two dielectric-layer pairs. In another embodiment, in the DBR structure 2200, the first optical thickness of the first dielectric layer and the second optical thickness of the second dielectric layer of each one of the dielectric-layer pairs are respectively larger than the first optical thickness of the first dielectric layer and the second optical thickness of the second dielectric layer of the adjacent previous one of the dielectric-layer pairs.

Figure 6:
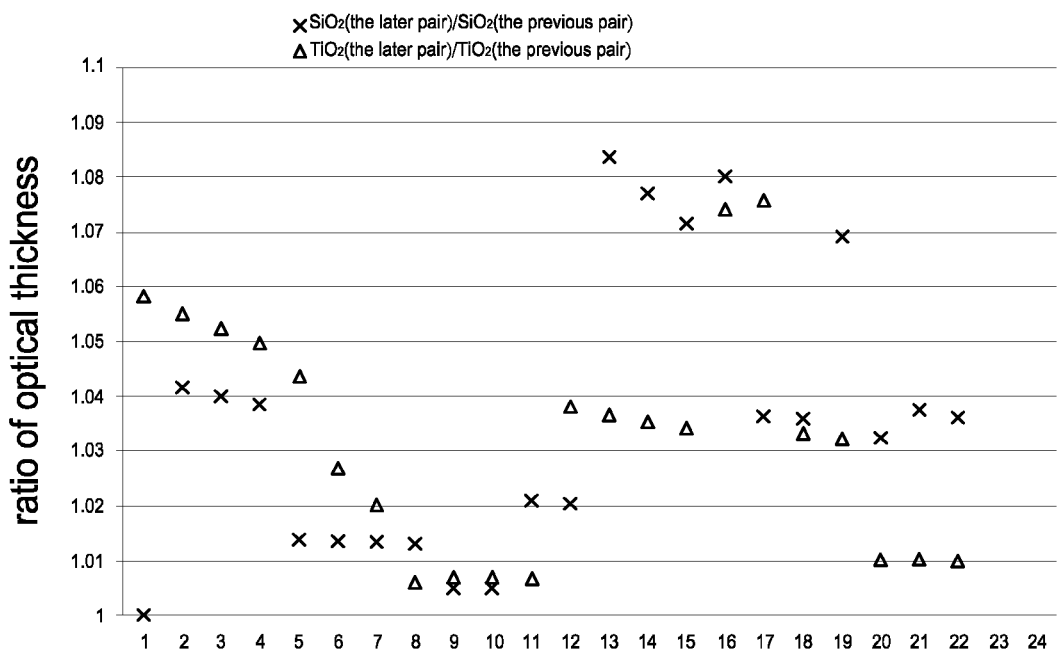
FIG. 6 illustrates a data showing that in the DBR structure 2200, the ratios of the optical thicknesses of the first dielectric layers of each one of the dielectric-layer pairs to those of its adjacent previous one of the dielectric-layer pairs, and the ratios of the optical thicknesses of the second dielectric layers of each one of the dielectric-layer pairs to those of its adjacent previous one of the dielectric-layer pairs, in accordance with an embodiment of the present disclosure.

FIG. 6 shows the ratios of the optical thicknesses of the first dielectric layers of every adjacent two of the dielectric-layer pairs, and the ratios of the optical thicknesses of the second dielectric layers of every adjacent two of the dielectric-layer pairs in the DBR structure 2200 disclosed in an embodiment of the present disclosure. In one embodiment, the optical thickness of the first dielectric layer of each of the dielectric-layer pairs and the optical thickness of the first dielectric layers of the adjacent previous one of the dielectric-layer pairs the ratio is greater than 1 and less than or equal to 1.1. In one embodiment, the optical thicknesses of the second dielectric layer of each of the dielectric-layer pairs and the optical thicknesses of the second dielectric layer of the adjacent previous one of the dielectric-layer pairs have a ratio, and the ratio is greater than 1 and less than or equal to 1.1. It should be noted that the disclosure refers to the light emission wavelength of the light-emitting device 20 at 550 nm as an exemplary description, but is not limited thereto. The light-emitting device 20 may emits light in other light bands, for example, UV light band (such as 350 nm to 400 nm), blue light band (such as 400 nm to 500 nm), green light band (such as 500 nm to 600 nm), red light band (such as 600 nm to 700 nm), or infrared light band (such as more than 700 nm), and in such cases, the first optical thickness of the first dielectric layer of each one of the dielectric-layer pair are greater than the first optical thickness of the first dielectric layer of the adjacent previous one of the dielectric-layer pairs; and/or, the second optical thickness of the second dielectric layer of each one of the dielectric-layer pair are greater than the second optical thickness of the second dielectric layer the adjacent previous one of the dielectric-layer pair.

Figure 7:
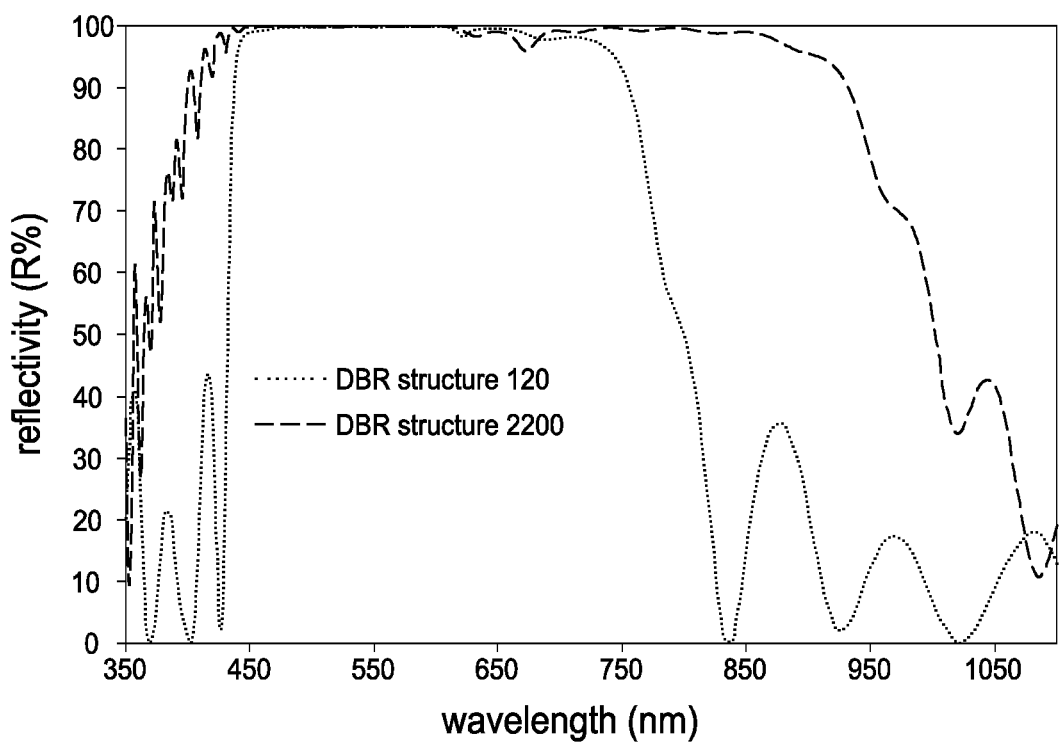
FIG. 7 illustrates a simulation data of the reflectivity of the DBR structure 2200 and the DBR structure 120 respectively to the incident light having a wavelength range of 350 nm to 1050 nm when the incident angle θ is 0 degrees, in accordance with an embodiment of the present disclosure.
Figure 8:
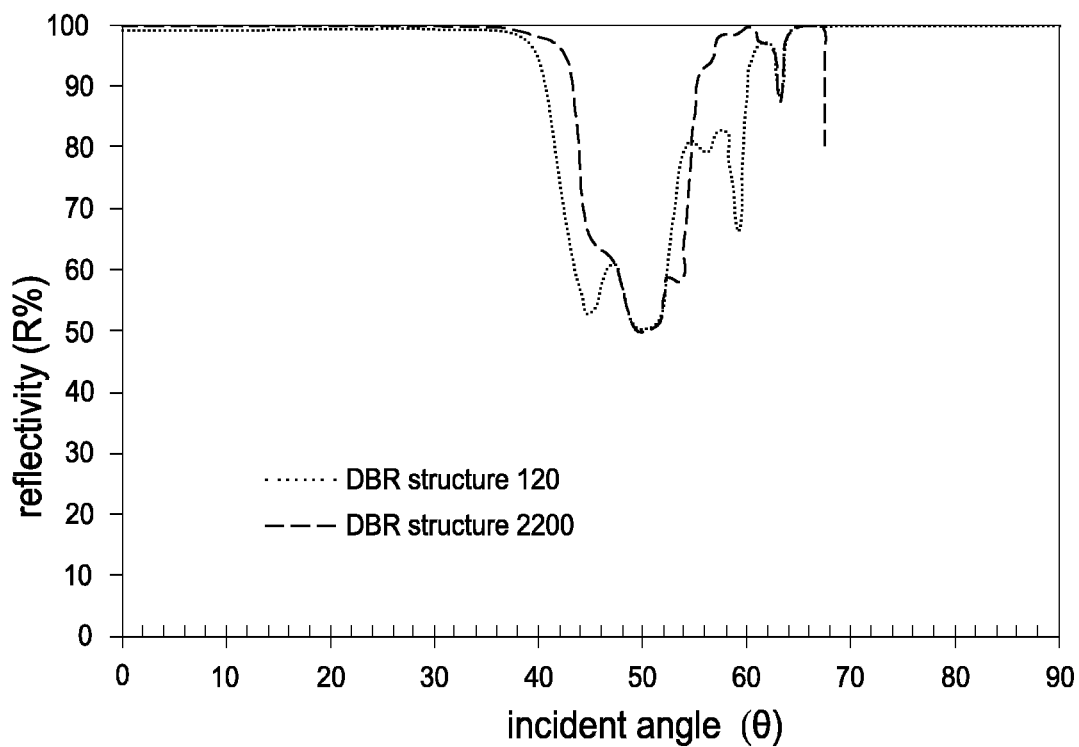
FIG. 8 illustrates a simulation data of the reflectivity of the DBR structure 2200 and the DBR 120 in a variety of different incident angle θ when the incident light wavelength is 450 nm, in accordance with an embodiment of the present disclosure.

FIG. 7 shows a simulation data of the reflectivity of the DBR structure 2200 to the incident light having a wavelength range of 350 nm to 1050 nm when the incident angle θ is 0 degree. As shown in FIG. 7, the DBR structure 2200 has a better reflection effect than the DBR structure 120. In the DBR structure 2200, the wavelength range of which the reflectivity is greater than 90% is about 409 nm to 930 nm, and the reflectivity in the wavelength range of 434 nm to 815 nm is closer to 100%. In addition, for the blue light band with a wavelength of 400 nm to 450 nm, the reflectivity of the DBR structure 2200 is significantly improved compared with the reflectivity of the DBR structure 120. FIG. 8 shows a simulation data of the reflectivity of the DBR structure 2200 and the DBR 120 disclosed in an embodiment of the present disclosure with a variety of different incident angle θ when the incident light wavelength is 450 nm. As shown in FIG. 8, the angle of incidence angle θ is in the range of 40 degrees to 65 degrees. The overall reflectivity of the DBR structure 2200 is better than the overall reflectivity of the DBR structure 120. The reflectivity of incident light at a large incident angle can be increased, thereby improving the light extraction efficiency of the light-emitting device 20.

Figure 9:
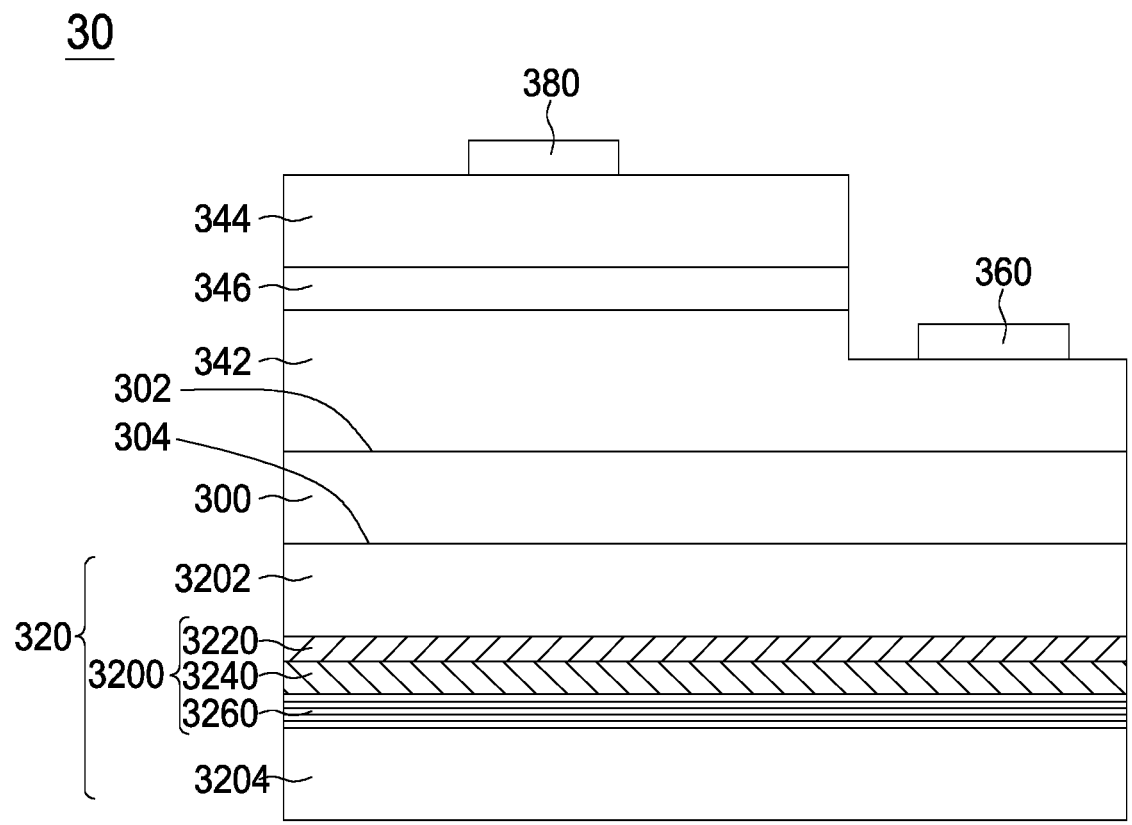
FIG. 9 illustrates a cross-sectional view of a light-emitting device, in accordance with an embodiment of the present disclosure.

FIG. 9 shows a cross-sectional view of a light-emitting device disclosed in an embodiment of the present disclosure. The light-emitting device 30 includes a substrate 300, a light extraction structure 320, a first conductive semiconductor layer 342, a second conductive semiconductor layer 344, an active layer 346 between the first conductive semiconductor layer 342 and the second conductive semiconductor layer 344, a first electrode 360 and a second electrode 380. For the relative positions or available materials of the first electrode 360 and the second electrode 380, reference may be made to the description of the corresponding structure of the light-emitting device 20 in the previous embodiments, and details are not described again. The substrate 300 includes a first surface 302 and a second surface 304. The light extraction structure 320 is located under the first surface 302 of the substrate 300, and includes a DBR structure 3200, an interface layer 3202 and an anti-interference layer 3204. The interface layer 3202 is located under the substrate 300. The anti-interference layer 3204 is located under the interface layer 3202. The DBR structure 3200 includes a plurality of film stacks and is located between the interface layer 3202 and the anti-interference layer 3204. The materials or functions of the interface layer 3202 and the anti-interference layer 3204 may be the same as the materials or functions of the interface layer 2202 and the anti-interference layer 2204 in the previous embodiments, and detail are not described again.

In one embodiment, the DBR structure 3200 has N film stacks sequentially formed along the direction from the first surface 302 of the substrate 300 outward, and N≥3. The term "N" used herein means the number of film stacks in the DBR structure 3200. In one embodiment, N is 3, for example, the DBR structure 3200 has a first film stack 3220, a second film stack 3240, and a third film stack 3260 sequentially formed along the direction from the first surface 302 of the substrate 300 outward. The sequential orders of the three film stacks can be changed. In one embodiment, the third film stack 3260 is closer to the substrate 300 than the first film stack 3220. For example, the DBR structure 3200 includes the third film stack 3260, the second film stack 3240 and the first film stack 3220 sequentially formed along the direction from the first surface 302 of the substrate 300 outward; or alternatively, the DBR structure 3200 includes the third film stack 3260, the first film stack 3220 and the second film stack 3240 sequentially formed along the direction from the first surface 302 of the substrate 300 outward.

In the DBR structure 3200, the N film stacks includes multiple dielectric-layer pairs, respectively. Each of the dielectric-layer pairs includes m dielectric layers, and m≥2. The term "m" used herein means the number of dielectric layers of each of the dielectric-layer pairs of the film stacks. In one embodiment, each of the dielectric-layer pairs includes a first dielectric layer and a second dielectric layer respectively. The N film stacks at least include a film stack, of which the multiple dielectric-layer pairs have the first dielectric layers having first optical thicknesses and the second dielectric layers having second optical thicknesses. The ratio of the first optical thickness to the second optical thickness is ranging between 1.5 and 2. In one embodiment, the first film stack 3220, the second film stack 3240, the third film stack 3260 respectively includes a plurality of first dielectric-layer pairs, a plurality of second dielectric-layer pairs, and a plurality of third dielectric-layer pairs (not shown). In the first dielectric-layer pairs, the second dielectric-layer pairs, and the third dielectric-layer pairs, each dielectric-layer pair includes a first dielectric layer and a second dielectric layer. The first dielectric layer has a first optical thickness and a first refractive index, and the second dielectric layer has a second optical thickness and a second refractive index. The value difference of the first refractive index and the second refractive index is at least 0.5, and preferably at least 1. In one embodiment, the materials of the first dielectric layer and the second dielectric layer includes titanium dioxides ($TiO_2$) and silicon dioxides ($SiO_2$), and the refractive index of $TiO_2$ and $SiO_2$ is 2.6 and 1.5 respectively.

Figure 10:
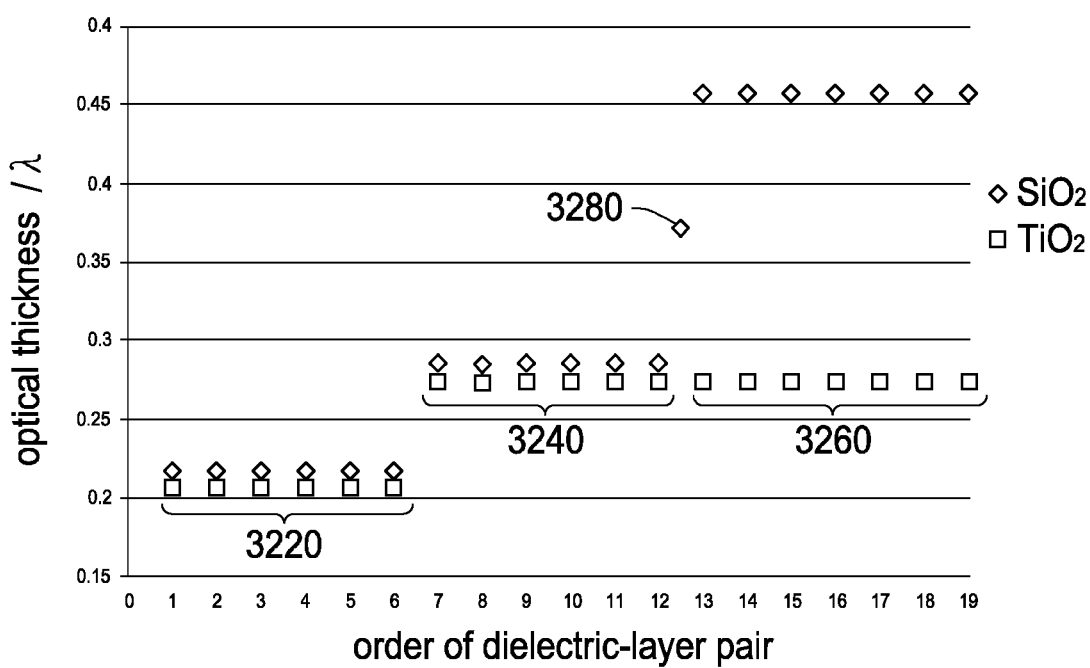
FIG. 10 illustrates a data showing that in the first film stacks, the second film stacks and the third film stacks of the DBR structure 3200, the ratios of the first optical thickness of the first dielectric layer and the second optical thickness of the second dielectric layer of each of the dielectric-layer pairs respectively to the central wavelength λ of the visible light band, in accordance with an embodiment of the present disclosure.

In one embodiment, the number of the dielectric-layer pairs of the first film stack 3220, the second film stack 3240 and the third film stack 3260 is ranging between 5 pairs and 10 pairs. In one embodiment, in each film stack the numbers of the dielectric-layer pairs may be an integer or a non-integer. When the number of the dielectric-layer pairs is a non-integer, the dielectric-layer pairs includes a half pair of the dielectric-layer pairs. The term "a half pair of the dielectric-layer pairs" used herein means one dielectric layer alone, such as one layer of the first dielectric layer or one layer of the second dielectric layer. FIG. 10 shows the ratios of the first optical thickness of the first dielectric layer to the central wavelength λ (such as 550 nm) of the visible light band (such as 400 nm to 700 nm) and the ratios of the second optical thickness of the second dielectric layer to the central wavelength λ of the visible light band respectively in each dielectric-layer pair in the first film stack 3220, the second film stack 3240, and the third film stack 3260 of the DBR structure 3200. As shown in FIG. 10, the first film stack 3220 includes 6 pairs of the dielectric-layer pairs, the second film stack 3240 includes 6 pairs of the dielectric-layer pairs, and the third film stack 3260 includes 7 pairs of the dielectric-layer pairs. When the difference of the optical thicknesses between the first dielectric layers and/or between the second dielectric layers of any adjacent two of the film stacks is too large, a conversion layer (or a conversion-layer pair) or an adjustment layer (or an adjustment-layer pair) may be included between the above-mentioned adjacent two film stacks. In one embodiment, the difference of the optical thicknesses between the $SiO_2$ dielectric layer of the last dielectric-layer pair of the second film stack 3240 and the $SiO_2$ dielectric layer of the first dielectric-layer pair of the third film stack 3260 is relatively large, and accordingly a conversion layer 3280 is inserted between the two film stacks. The conversion layer 3280 has an optical thickness ranging between those of the $SiO_2$ dielectric layer of the last dielectric-layer pair of the second film stack 3240 and of the $SiO_2$ dielectric layer of the first dielectric-layer pair of the third film stack 3260. In one embodiment, additional one or multiple film stacks may be formed behind the third film stack 3260. The additional one or multiple film stacks include one or multiple dielectric-layer pairs. The ratios of the optical thicknesses of the first dielectric layers and the second dielectric layers respectively to the central wavelength λ (such as 550 nm) of the visible light band (such as 400 nm to 700 nm) are lower than the ratio of each dielectric layer of the first film stack 3220 to the central wavelength of the visible light band; lower than the ratio of each dielectric layer of the second film stack 3240 to the central wavelength of the visible light band; or lower than the ratio of each dielectric layer of the third film stack 3260 individually to the central wavelength of the visible light band. The number of the dielectric-layer pairs or the number of conversion layers (or a conversion layer pair) in each film stack can be reduced or increased according to product applications or optical requirements.

Figure 11:
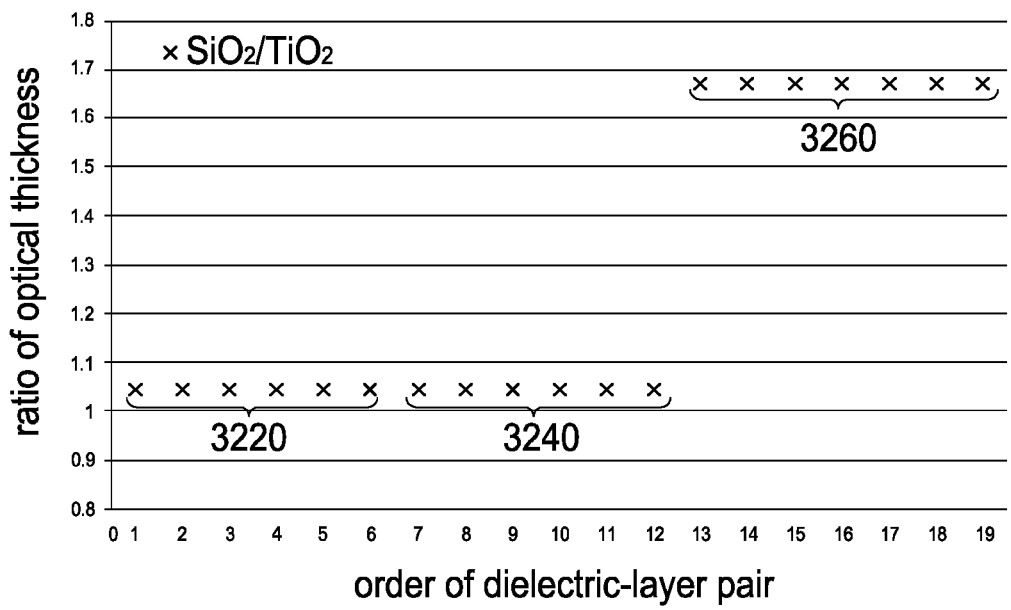
FIG. 11 illustrates a data showing that in the first film stack, the second film stack and the third film stack of the DBR structure 3200, the ratios of the optical thickness of the first dielectric layer to the optical thickness of the second dielectric layer of each of dielectric layer, in accordance with an embodiment of the present disclosure.

FIG. 11 shows the ratio of the optical thickness of the first dielectric layer to the optical thickness of the second dielectric layer in each dielectric-layer pair of the first film stack 3220, the second film stack 3240 and the third film stack 3260 of the DBR structure 3200 disclosed in an embodiment of the present disclosure. In each dielectric-layer pair of the first film stack 3220, the ratio of the optical thickness of the first dielectric layer to the optical thickness of the second dielectric layer is ranging between 0.8 and 1.2. In each dielectric-layer pair of the second film stack 3240, the ratio of the optical thickness of the first dielectric layer to the optical thickness of the second dielectric layer is ranging between 0.8 and 1.2. In each dielectric-layer pair of the second film stack 3240, the ratio of the optical thickness of the first dielectric layer to the optical thickness of the second dielectric layer is ranging between 1.5 and 1.8. It should be noted that the visible light band which may range from 400 nm to 700 nm with a central wavelength of 550 nm is used for exemplary illustrations of the disclosure, but not limited thereto. The light-emitting device 30 may emit light in other light bands, for example, UV light band (such as 350 nm to 400 nm), blue light band (such as 400 nm to 500 nm), green light band (such as 500 nm to 600 nm), red light band (such as 600 nm to 700 nm), or infrared light band (such as more than 700 nm). In the second film stack 3220, the second film stack 3240, and the third film stack 3260 of the DBR structure 3200, the ratio of the first optical thickness of the first dielectric layer to the second optical thickness of the second dielectric layer of each dielectric-layer pair also conforms to the above range.

In one embodiment, the materials of the first dielectric layer in the first film stack 3220, the second film stack 3240, and the third film stack 3260 are the same as each other, such as $SiO_2$, and the materials of the second dielectric layer of the first film stack 3220, the second film stack 3240, and the third film stack 3260 are also the same as each other, such as $TiO_2$. In another embodiment, the material of the first dielectric layer in the first film stack 3220, the second film stack 3240, and/or the third film stack 3260 are different from each other, and the materials of the second dielectric layer of the first film stack 3220, the second film stack 3240, and the third film stack 3260 are also different from each other. It is regarded as to be conformed with the technical principles disclosed herein, as long as the ratio of the first optical thickness of the first dielectric layer to the second optical thickness of the second dielectric layer in each dielectric-layer pair in the first film stack 3220, the second film stack 3240 or the third film stack 3260 falls within the above-mentioned range.

Figure 12:
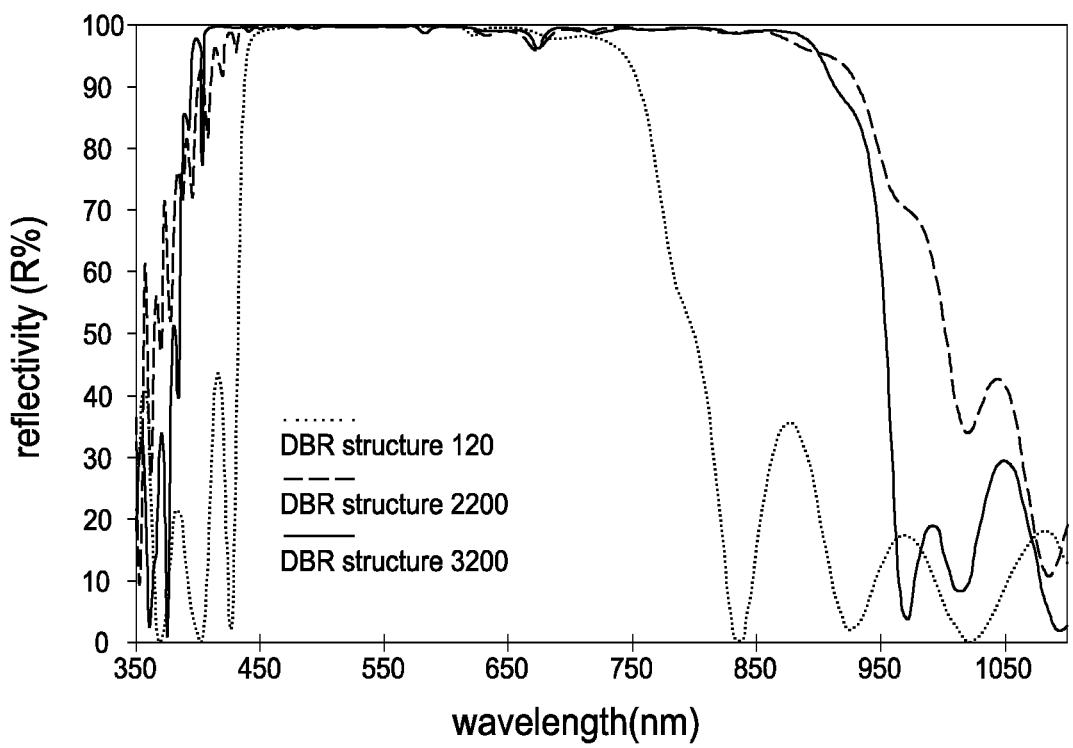
FIG. 12 illustrates a simulation data of the reflectivity of the DBR structure 3200, the DBR structure 2200 and the DBR structure 120 respectively to the incident light having a wavelength range of 350 nm to 1050 nm when the incident angle θ is 0 degree, in accordance with an embodiment of the present disclosure.
Figure 13:
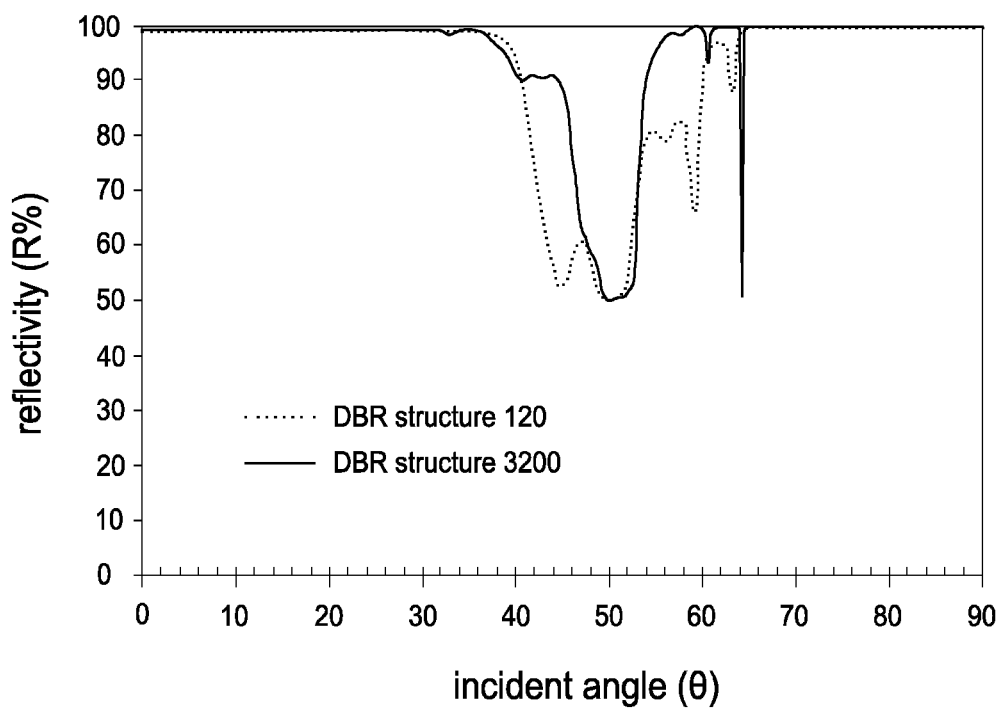
FIG. 13 illustrates a simulation data of the reflectivity of the DBR structure 3200 and the DBR structure 120 in a variety of different incident angle θ when the incident light wavelength is 450 nm, in accordance with an embodiment of the present disclosure.

FIG. 12 shows a simulation data of the reflectivity of the DBR structure 3200, the DBR structure 2200 and the DBR structure 120 individually to the incident light having a wavelength range of 350 nm to 1050 nm when the incident angle θ is 0 degree. As shown in FIG. 12, the DBR structure 3220 has a better reflection effect than the DBR structure 120. In the DBR structure 3220, the wavelength range of which the reflectivity is greater than 90% is about 394 nm to 930 nm and 404 nm to 912 nm, and especially the reflectivity in the wavelength range of 406 nm to 872 nm is closer to 100%. In addition, for the blue light band with a wavelength of 400 nm to 450 nm, the reflectivity of the DBR structure 3220 is significantly improved compared with the reflectivity of the DBR structure 120. FIG. 13 shows a simulation data of the reflectivity of the DBR structure 3220 and the DBR 120 in a variety of different incident angle θ when the incident light wavelength is 450 nm. As shown in FIG. 13, the angle of incidence angle θ is in the range of 40 degrees to 65 degrees. The overall reflectivity of the DBR structure 3220 is better than the overall reflectivity of the DBR structure 120. The reflectivity of incident light at a large incident angle can be increased, thereby improving the light extraction efficiency of the light-emitting device 30.

Figure 14:
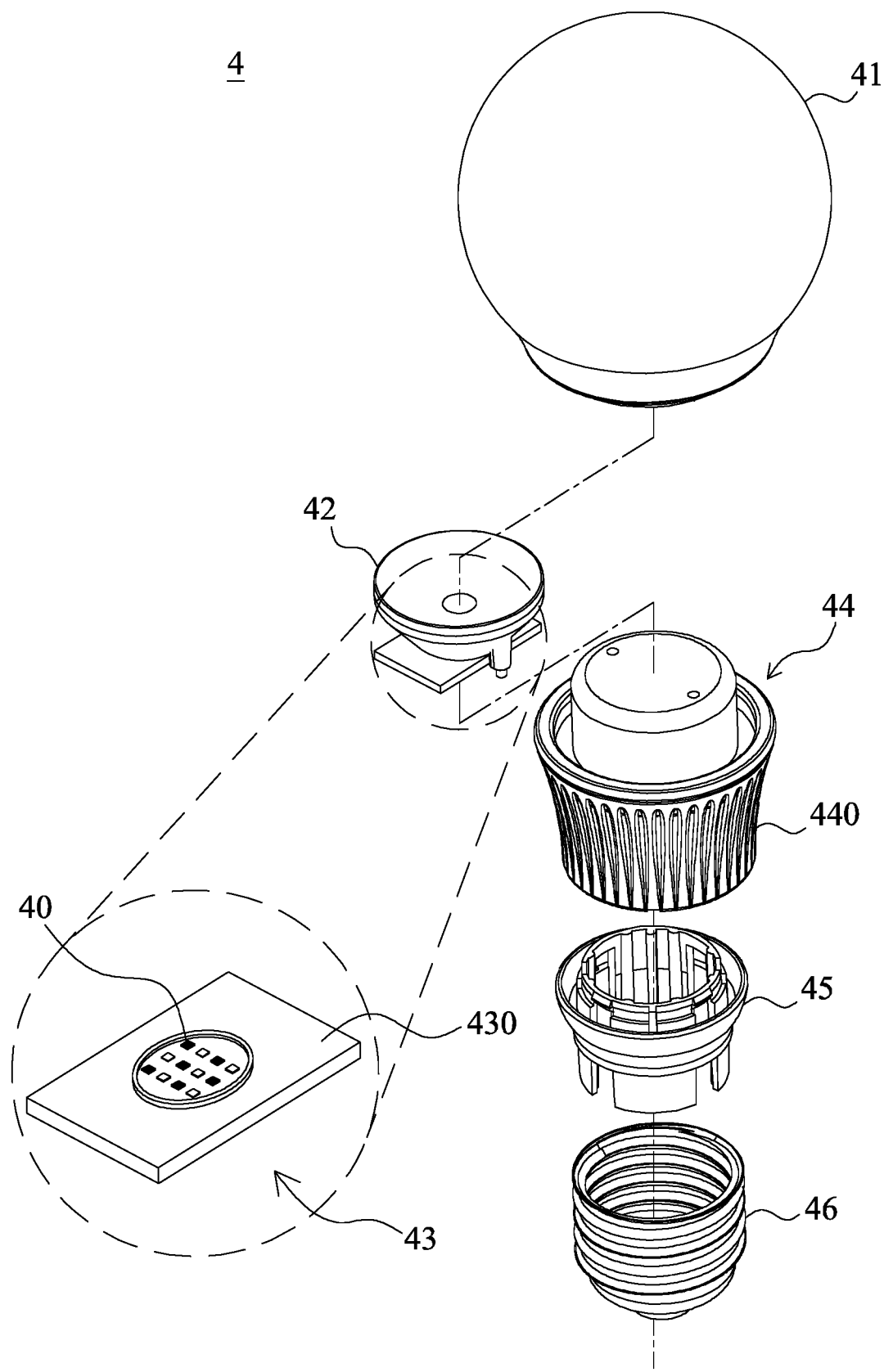
FIG. 14 illustrates a schematic exploded view of a light bulb in accordance with another embodiment of the present disclosure.

FIG. 14 illustrates a schematic exploded view of a light bulb 4 according to another embodiment of the present disclosure. The light bulb 4 includes multiple light-emitting devices 40 as illustrated according to any of the above-mentioned embodiments, a lamp cover 41, a lens 42, a lighting module 43, a lamp holder 44, a connecting portion 45, an electrical connector 46. The lens 42 is placed in the lamp cover 41. The lighting module 43 located below the lens 42 and includes a carrier 430. The lamp holder 44 includes a heat sink 440 to support the lighting module 43. The connecting portion 45 connects the electrical connector 46 to the lamp holder 44. The lighting module 43 further includes a carrier 430, and the light-emitting device 40 is located on the carrier 430.

However, the above embodiments are only for illustrative purposes to explain the principles and effects of this application, and are not intended to limit this application. Any person with ordinary knowledge in the technical field to which this application belongs can modify and change the above embodiments without departing from the technical principles and spirit of this application. Therefore, the scope of protection of the rights in this application is listed in the scope of patent application described later.

What is claimed is:

1. A light-emitting device, comprising:
a substrate comprising a first surface and a second surface opposite to the first surface;
a light-emitting stack formed on the first surface of the substrate, wherein the light-emitting stack comprises a first semiconductor layer, a second semiconductor layer, and an active layer between the first semiconductor layer and the second semiconductor layer; and
a distributed Bragg reflection structure formed on the second surface of the substrate, wherein the distributed Bragg reflection structure comprises a film stack comprising at least four dielectric layer pairs consecutively arranged outward from the second surface, wherein each of the dielectric-layer pairs comprises a first dielectric layer having an optical thickness and a second dielectric layer having an optical thickness;
wherein the optical thickness of the first dielectric layer of each one of the dielectric-layer pairs is greater than the optical thickness of the first dielectric layer of an adjacent previous one of the dielectric-layer pairs from the second surface outward.

2. The light-emitting device according to claim 1, further comprising an anti-interference layer, wherein the distributed Bragg reflection structure is located between the substrate and the anti-interference layer.

3. The light-emitting device according to claim 2, wherein the anti-interference layer has an optical thickness which is ⅛ times a central wavelength of a visible light band.

4. The light-emitting device according to claim 1, wherein the optical thickness of the first dielectric layer of each of the dielectric-layer pairs and the optical thickness of the first dielectric layers of the adjacent previous one of the dielectric-layer pairs have a ratio, and the ratio is greater than 1 and less than or equal to 1.1.

5. The light-emitting device according to claim 1, wherein the optical thickness of the second dielectric layer of each of the dielectric-layer pairs is greater than the optical thickness of the second dielectric layer of an adjacent previous one of the dielectric-layer pairs from the second surface outward.

6. The light-emitting device according to claim 5, wherein the optical thicknesses of the second dielectric layer of each of the dielectric-layer pairs and the optical thicknesses of the second dielectric layer of the adjacent previous one of the dielectric-layer pairs have a ratio, and the ratio is greater than 1 and less than or equal to 1.1.

7. The light-emitting device according to claim 1, further comprising an interface layer between the substrate and the distributed Bragg reflection structure.

8. The light-emitting device according to claim 7, wherein the interface layer has an optical thickness which is greater than or equal to a length of a central wavelength of a visible light band.

9. The light-emitting device according to claim 3, wherein the visible light band ranges between 400 nm and 700 nm, and the central wavelength is 550 nm.

10. The light-emitting device according to claim 8, wherein the visible light band ranges between 400 nm and 700 nm, and the central wavelength is 550 nm.

11. A light-emitting device, comprising:
a substrate comprising a first surface and a second surface opposite to the first surface;
a light-emitting stack formed on the first surface of the substrate, wherein the light-emitting stack comprises a first conductive semiconductor layer, a second conductive semiconductor layer, and an active layer between the first conductive semiconductor layer and the second conductive semiconductor layer;
a distributed Bragg reflection structure formed on the second surface of the substrate, wherein the distributed Bragg reflection structure comprises a first film stack and a second film stack;
wherein the first film stack comprises a plurality of first dielectric-layer pairs, the second film stack comprises a plurality of second dielectric-layer pairs, each of the first dielectric-layer pairs and each of the second dielectric-layer pairs respectively comprises a first dielectric layer having an optical thickness and a second dielectric layer having an optical thickness;
wherein in each of the dielectric-layer pairs of the first film stack, the optical thickness of the first dielectric layer and the optical thickness of the second dielectric layer have a ratio, and the ratio is greater than or equal to 1.5 and less than or equal to 1.8.

12. The light-emitting device according to claim 11, wherein the first film stack is nearer to or farther from the second surface of the substrate than the second film stack.

13. The light-emitting device according to claim 11, further comprising an interface layer between the substrate and the distributed Bragg reflection structure.

14. The light-emitting device according to claim 13, wherein the interface layer has an optical thickness which is greater than or equal to a length of a central wavelength of a visible light band.

15. The light-emitting device according to claim 11, wherein in the second film stack, the optical thicknesses of the first dielectric layer and the second dielectric layer of each of the dielectric-layer pairs have a ratio, and the ratio is greater than or equal to 0.8, and less than or equal to 1.2.

16. The light-emitting device according to claim 11, further comprising a third film stack wherein the third film stack comprises a plurality of third dielectric-layer pairs between the first film stack and the second film stack, or nearer to or farther from the second surface of the substrate than the first film stack and the second film stack.

17. The light-emitting device according to claim 11, further comprising an anti-interference layer, wherein the distributed Bragg reflection structure is located between the substrate and the anti-interference layer.

18. The light-emitting device according to claim 17, wherein the anti-interference layer has an optical thickness which is ⅛ times a central wavelength of a visible light band.

19. The light-emitting device according to claim 14, wherein the visible light band ranges between 400 nm and 700 nm, and the central wavelength is 550 nm.

20. The light-emitting device according to claim 18, wherein the visible light band ranges between 400 nm and 700 nm, and the central wavelength is 550 nm.

\* \* \* \* \*